(12) United States Patent
Pascucci

(10) Patent No.: US 6,249,463 B1
(45) Date of Patent: Jun. 19, 2001

(54) ADDRESS LATCH ENABLE SIGNAL CONTROL CIRCUIT FOR ELECTRONIC MEMORIES

(75) Inventor: Luigi Pascucci, Sesto San Giovanni (IT)

(73) Assignee: STMicroelectronics S.r.l., Milan (IT)

( * ) Notice: Subject to any disclaimer, the term of this patent is extended or adjusted under 35 U.S.C. 154(b) by 0 days.

(21) Appl. No.: 09/457,500

(22) Filed: Dec. 8, 1999

(51) Int. Cl.[7] .................................................. G11C 7/00
(52) U.S. Cl. .................... 365/194; 365/230.08; 365/233; 711/167; 711/500; 711/714; 711/713
(58) Field of Search .............................. 365/194, 230.08, 365/233; 711/167, 500, 714, 713

(56) References Cited

U.S. PATENT DOCUMENTS 5,548,560 * 8/1996 Stephens, Jr. et al. ........... 365/233.5
5,896,341 * 4/1999 Takahashi ....................... 365/230.06

* cited by examiner

*Primary Examiner*—David Nelms
*Assistant Examiner*—Connie C. Yoha
(74) *Attorney, Agent, or Firm*—Jenkens & Gilchrist, P.C.; Theodore E. Galanthay

(57) ABSTRACT

An address latch enable signal control circuit for electronic memories, including: a circuit for sensing an external address latch enable signal; a switching circuit connected in output to the sensing circuit; an address storage circuit, connected in output to the switching circuit and to the address sensing circuit; the switching circuit being suitable to determine the switching between a first circuit path and a second circuit path for connection between the address sensing circuit and the address storage circuit; the first circuit path connecting the sensing circuit directly to the storage circuit across the switching circuit; the second circuit path connecting the sensing circuit to the storage circuit with a delay circuit interposed, the delay circuit being suitable to produce a time delay in the connection between the address sensing circuit and the address storage circuit, the sensing circuit being suitable to generate an internal address latch enable signal meant to be stored in is the storage circuit.

32 Claims, 4 Drawing Sheets

US 6,249,463 B1

ADDRESS LATCH ENABLE SIGNAL CONTROL CIRCUIT FOR ELECTRONIC MEMORIES

BACKGROUND OF THE INVENTION

The present invention relates to an address latch enable signal control circuit for electronic memories. More particularly, the invention relates to an address latch signal control circuit for both volatile and nonvolatile memories which not only ensures correct address reading but also ensures certainty of the intention to acquire an address which is external to the memory.

It is known that volatile and permanent electronic memories point to one of their internal locations by using interposed structures, such as for example latch circuits or counters.

In order to operate correctly, these structures require suitable control signals which determine and allow the loading of a new address from outside the memory.

The control signal, usually known as ALE (Address Latch Enable), generally has several characteristics which are very important for its effectiveness and validity when it is necessary to operate in extreme conditions, such as for example those entailed by a high address acquisition rate, which introduces acquisition problems.

A first one of these characteristics is the duration of the control pulse. When this duration is too short, bad address capture conditions occur: at high rates, the pulse (control signal) is very narrow and address capture is unsteady.

A second characteristic is the filtering of noise-related pulses (spikes) which can lead to false and unintended address loadings.

A third characteristic of the control signal is to recognize authentic and non-authentic ALE pulses for the memory. For example, when a standby condition occurs, every activation of the ALE line is to be understood as being aimed at address capture activities on the part of another device that belongs to the system, but this address is not pertinent to the electronic memory being considered.

In normal and ideal operating conditions of the system, the above conditions, despite being stringent, are not difficult to meet, since it is sufficient to design them suitably during the construction of the system.

However, it is necessary to ensure that the ALE control signal is not independent of the other fundamental control signals of the memory, such as for example CE and RD.

For memories with an interleaved architecture, this last characteristic becomes particularly important, since synchronization among the various control signals introduces significant "sensitivities" which must be eliminated.

A first negative sensitivity is caused by return from a standby condition of the memory (i.e., when CEn switches from 1 to 0) while the ALE pulse is already active. In this situation, since the switching of the chip enable signal (CEn) occurs with a delay with respect to the ALE pulse, this causes a sort of "slicing" of the address capture pulse, consequently making said address capture critical.

If the switching delay of the CEn signal is excessive, this can even cause absence of the internal pulse (total suppression of the external pulse).

Another significant drawback occurs in the transition from the active step to the standby step (i.e., when the signal CEn switches from 0 to 1) when the ALE pulse is present. In this case, if the ALE pulse occurs too early with respect to the switching of the CEn signal, the external ALE pulse is interpreted incorrectly and, by generating an internal pulse, an unintended address capture occurs.

SUMMARY OF THE INVENTION

The aim of the present invention is to provide an address latch enable signal control circuit for electronic memories which allows to distinguish between address latch pulses related to the memory and address latch pulses intended for other units, in order to appropriately promote address capture operations.

Within the scope of this aim, an object of the present invention is to provide an address latch enable signal control circuit for electronic memories in which the duration of the address latch pulse is as short as possible yet sufficient to ensure correct address capture.

Another object of the present invention is to provide an address latch enable signal control circuit for electronic memories which allows to synchronize the address latch enable signal with the fundamental memory control signals, such as the CE signal and the RD signal.

Another object of the present invention is to provide an address latch enable signal control circuit for electronic memories which improves the performance of the memory during return from standby with the address latch enable pulse already active and during transition from the active step to the standby step while the address latch enable pulse is present.

Another object of the present invention is to provide an address latch enable signal control circuit for electronic memories which allows to extend the address latch pulse for a memory in order to improve the capture capability thereof.

Another object of the present invention is to provide an address latch enable signal control circuit for electronic memories which allows to filter noise pulses which can cause unwanted address loadings.

Another object of the present invention is to provide an address latch enable signal control circuit for electronic memories which is highly reliable, relatively easy to manufacture and at competitive costs.

This aim, these objects and others which will become apparent hereinafter are achieved by an address latch enable signal control circuit for electronic memories, characterized in that it comprises:

means for sensing an external address latch enable signal;

switching means connected in output to said sensing means;

address storage means, connected in output to said switching means and to said address sensing means;

said switching means being suitable to determine the switching between a first circuit path and a second circuit path for connection between said address sensing means and said address storage means;

said first circuit path connecting said sensing means directly to said storage means across said switching means;

said second circuit path connecting said sensing means to said storage means with delay means interposed, said delay means being suitable to produce a time delay in the connection between said address sensing means and said address storage means, said sensing means being suitable to generate an internal address latch enable signal meant to be stored in said storage means.

BRIEF DESCRIPTION OF THE DRAWINGS

Further characteristics and advantages of the present invention will become apparent from the following detailed description of a preferred but not exclusive embodiment of the control circuit according to the invention, illustrated only by way of non-limitative example in the accompanying drawings, wherein.

DESCRIPTION OF THE PREFERRED EMBODIMENT

Figure 1:
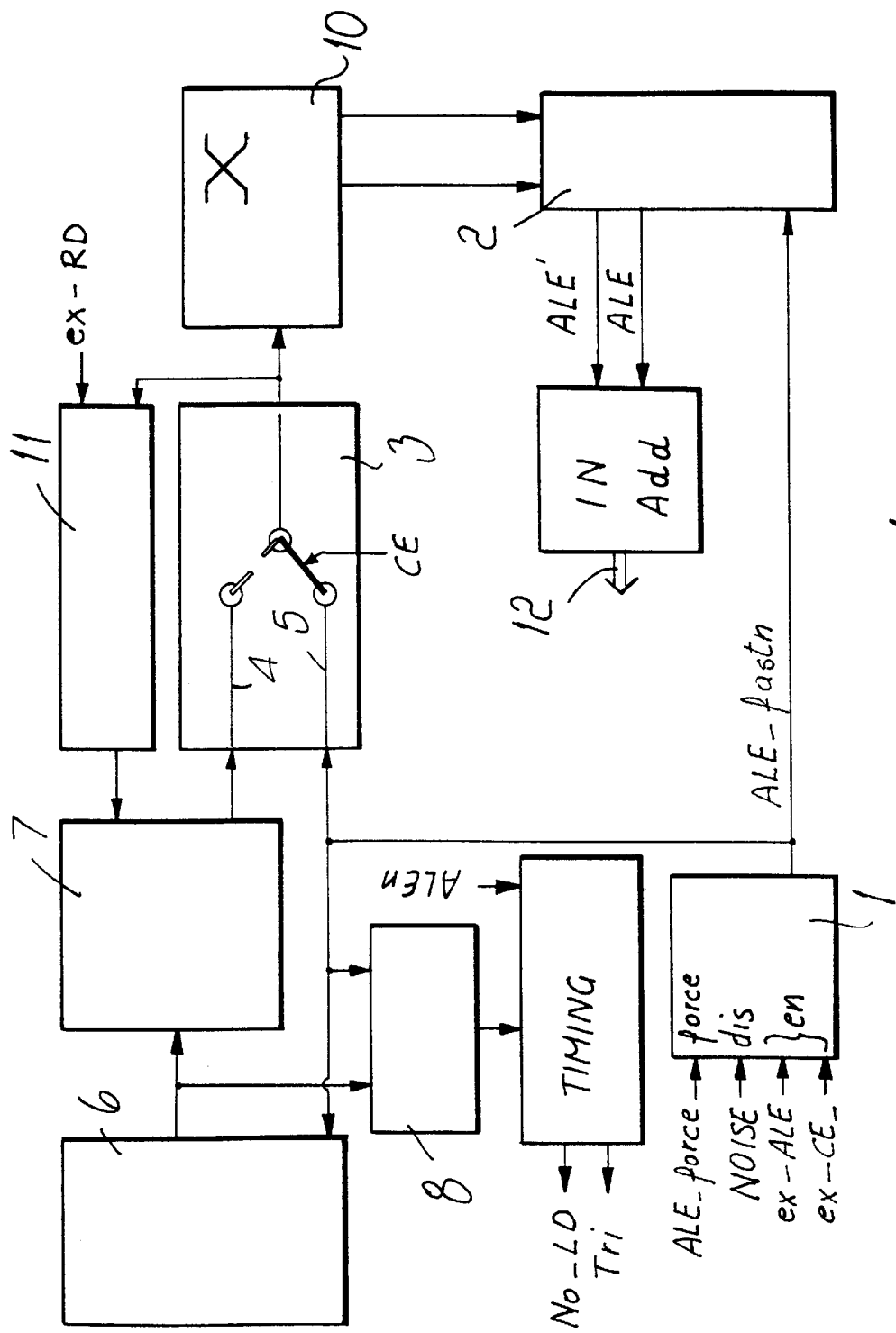
FIG. 1 is a block diagram of the address latch enable signal control circuit according to the present invention.

With reference to the above figures, and initially to FIG. 1, the control circuit according to the present invention comprises means for sensing the address latch enable signal ALE which are designated by the reference numeral 1 and receive in input a signal ALE-force for forcing the signal ALE from outside the memory, a signal NOISE for disabling the means 1, and a signal ex-ALE and a signal ex-CE, both for enabling the means 1. The means for sensing the signal ALE emit in output a signal ALE-fastn which is sent to means 2 for storing the signal ALE and to switching means 3 which perform a switching between two different paths, a slow path 4 and a fast path 5, whose meaning will be described in detail hereinafter. The switching means 3 are bidirectionally connected to means 6 for delaying the signal ALE, which are in turn connected to means 7 for adjusting the delay of the signal ALE and to means for generating a signal ALE-fast 8, which receive in input, in addition to the output of the means 6 for delaying the signal ALE, the signal ALE-fastn as well.

The slow/fast path switching means 3 are connected in output to latch means 10 for the signal ALE which are in turn connected to the means 2 for storing the signal ALE.

The path switching means 3 are finally connected to means 11 for extending the duration of the signal ALE, which receive in input an external read signal ex-RD and are connected in output to the means 7 for adjusting the delay of the signal ALE.

The means 2 for temporarily storing the signal ALE emit in output a signal ALE and a signal ALE', which are sent to an address bus 12 for capturing the read address of the electronic memory.

As shown by FIG. 1, the switching means 3 are driven, as regards slow/fast path switching, by the chip enable signal CE, which is one of the fundamental signals for reading an electronic memory.

Figure 3:
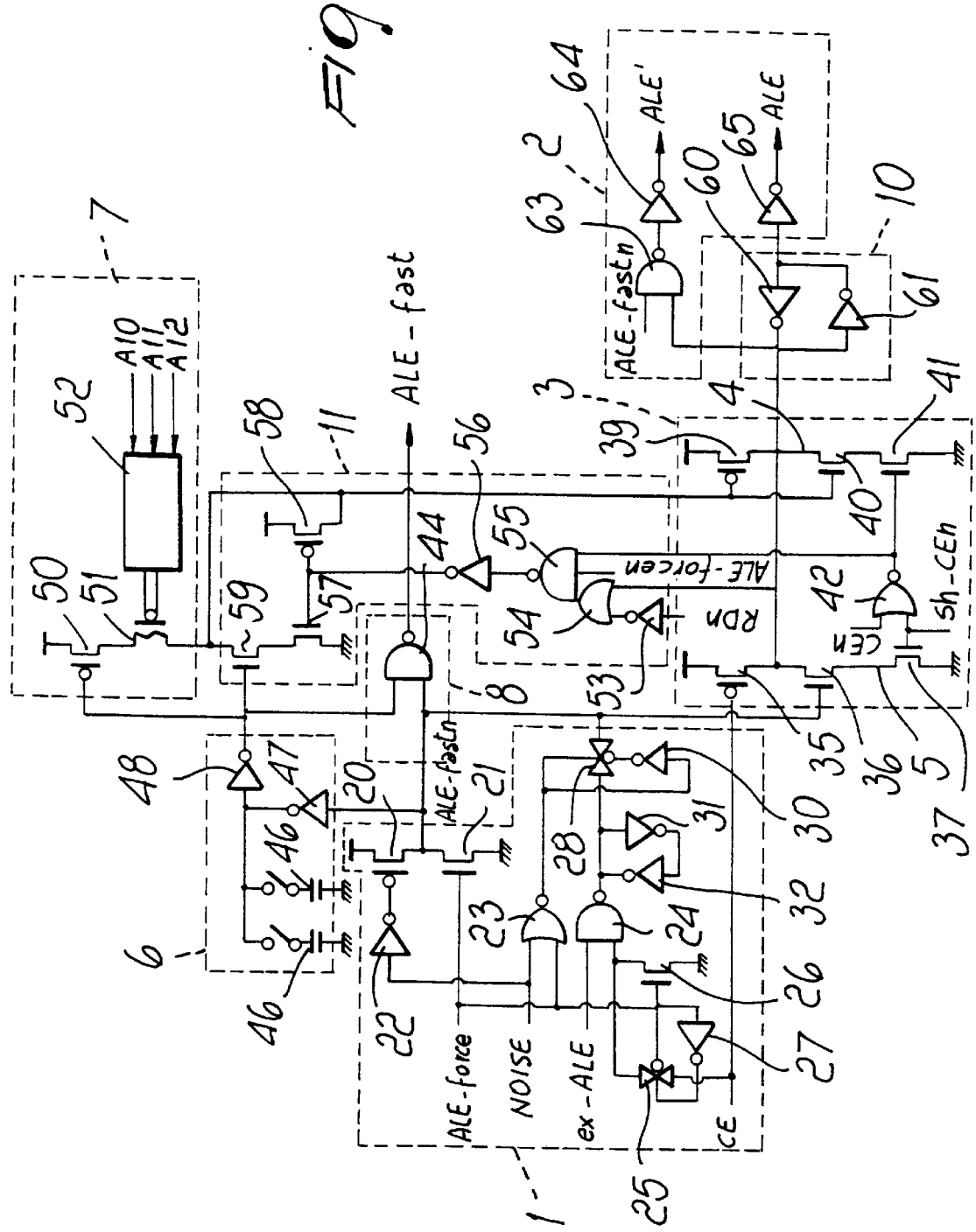
FIG. 3 is a circuit diagram of the address latch enable signal control circuit shown in FIG. 1.

With reference now to FIG. 3, which is an exemplifying circuit diagram of the block diagram of FIG. 1, the means 1 for sensing the signal ALE comprise two MOS transistors, respectively of the P-channel type 20 and of the N-channel type 21, which are connected between a supplyvoltage and the ground and are mutually series-connected; the N-channel MOS transistor 21 receives the signal ALE-force at its gate terminal, whereas the P-channel MOS transistor 20 receives in input the signal NOISE, which passes through an inverter 22 before arriving in input to its gate terminal.

The signal NOISE is furthermore input to a NOR gate 23 with two inputs, whose other input is the ALE-force signal. A NAND gate with two inputs 24 instead receives in input the signal ex-ALE in addition to the signal CE, which passes through a pass transistor 25 before arriving in input to the NAND gate 24.

The signal ALE-force is furthermore sent in input to an N-channel MOS transistor 26, which is connected between the input of the NAND gate 24 to which the signal CE is supplied and the ground.

The gate terminal of the MOS transistor 26 is connected to the gate terminal of the P-channel transistor that constitutes the pass transistor 25.

An inverter 27 is connected to the gate terminal of the N-channel MOS transistor that constitutes the pass transistor 25.

The output of the NOR gate 23 is sent to a second pass transistor 28 and so is the output of the NAND gate 24.

The pass transistor 28 is connected, by means of the gate terminal of the P-channel MOS transistor that is one of the two transistors that constitutes it, to an inverter 30 which is connected to the output of the NOR gate 23.

The output of the NAND gate 24 is connected to two inverters 31 and 32 which are interposed between the NAND gate 24 and the pass transistor 28.

The means 1 for sensing the signal ALE are connected to the switching means 3 and in particular the signal CE is sent to a first fast circuit branch 5 of the switching means 3 and in particular to the gate terminal of a P-channel MOS transistor 35 which is connected between the supply voltage and an N-channel MOS transistor 36, which is in turn connected to another N-channel MOS transistor 37 whose source terminal is connected to the ground.

In practice, the first circuit branch 5 of the switching means 3 comprises three MOS transistors which are connected in series and are designated by the reference numerals 35, 36 and 37 respectively.

Likewise, the second slow circuit branch 4 of the switching means 3 comprises three MOS transistors, i.e., a P-channel MOS transistor 39 which is series-connected to two N-channel MOS transistors 40 and 41, the MOS transistor 41 being connected to the ground.

The switching means 3 further comprise a NOR gate 42 which is interposed between the N-channel MOS transistor 37 and the N-channel MOS transistor 41. The NOR gate 42 receives, as its first input, the signal CEn and a signal sh-CEn which determines which branch of the switching means 3 is to be used, i.e., the slow branch 4 or the fast branch 5.

The output signal of the first switching means 3, designated by ALE-fastn, taken at the node connecting the MOS transistors 20 and 21, is sent in input to the N-channel MOS transistor 36 of the switching means 3 and in input to means for generating the signal ALE-fast which comprise a NAND gate 44 with two inputs, the second of which is specified in detail hereinafter.

The output of the NAND gate 44 is the signal ALE-fast.

The signal in output from the means 1 for sensing the signal ALE, i.e., the signal ALE-fastn, is furthermore sent to the means 6 for delaying the signal ALE, which comprise a plurality of capacitors 46 arranged mutually in parallel, an inverter 47, which receives in input the signal ALE-fastn, and a second inverter 48, which is connected in output to the gate terminal of a transistor which belongs to the means 11 for extending the signal ALE, which will be described hereinafter.

The means 6 for delaying the signal ALE are further connected to the delay adjustment means 7, which comprise a P-channel MOS transistor 50 which receives in input the output signal of the inverter 48 and is connected to a further P-channel transistor 51 which is connected to adjustment means 52.

The means 11 for extending the duration of the signal ALE comprise a first inverter 53, which receives in input the signal RDn and whose output is connected to an OR gate 54 which receives, as its other input, the signal taken at the node connecting the transistors 35 and 36 of the slow circuit branch 4 of the switching means 3. The output of the OR gate 54 constitutes the first input in the three-input NAND gate 55, whose second input is the signal ALE-forcen and whose third input is the signal in output from the NOR gate 42 which constitutes the connection between the first fast circuit branch 5 and the second slow circuit branch 4 of the switching means 3. The output of the NAND gate 55 is sent to an inverter 56 whose output is connected to gate terminals of two MOS transistors 57 and 58, respectively of the N-channel and P-channel types, which are respectively connected to a further transistor 59 which is in turn connected to the MOS transistor 51 and, as regards the MOS transistor 58, by means of its drain terminal to the intermediate node between the MOS transistors 51 and 59.

The means 10 for latching the signal ALE, connected to the switching means 3, comprise two inverters 60 and 61 which are parallel-connected and are in turn connected to the temporary storage means 2 for the latch signal ALE. Said storage means comprise a NAND gate 63 with two inputs: the signal ALE-fastn is sent to a first one of said inputs and the output of the inverter 60 is sent to a second one of said inputs. The output of the NAND gate 63 is connected to an inverter 64, whose output is the signal ALE', whereas the output of the inverter 61 is connected to an additional inverter 65 whose output is the signal ALE.

With reference again to the block diagram of FIG. 1, the control circuit according to the present invention can be seen to operate according to two different paths, a slow path 4 and a fast path 5, depending on the signal CE that appears at the input of the switching means 3.

The fast path 5 of the switching means 3 is activated upon return from a standby condition of the memory and provides an immediate response, whereas the slow path 4 is selected when the memory is in the active condition and it is necessary to filter noise-related pulses and to recognize the actual intention to perform address updating in said memory.

Therefore, upon a return of the memory from standby, i.e., when the signal CEn switches from high to low, the path followed by the control circuit is the one by means of which the signal in output from the sensing means 1 is sent to the switching means 3, where the fast path 5 is activated and the signal is fed directly to the latch means 10 and from there to the temporary storage means 2 in order to generate the signal ALE. It should be noted that the signal ex-ALE is an "external" address latch signal, whereas the signals ALE-fast (and its inverted equivalent), ALE', ALE are all signals which are internal to the control circuit according to the present invention.

When instead the memory is in the "active mode", i.e., when a transition from the active mode to standby occurs while the signal CEn is switching from low to high, then the active path is the one by means of which the signal in output from the sensing means 1 is sent to the means 6 for delaying the signal ALE and from there to the delay adjustment means 7 in order to then activate the slow path 4 and then store the signal of the latch means 10 and from there to the temporary storage means 2 in order to produce the signal ALE'.

Both paths of the switching means 3, i.e., the slow path 4 and the fast path 5, are connected to the means 11 for extending the signal ALE, which allow to extend the duration of the ALE pulse which is internal to the control circuit.

This allows to improve the capture capability of the signal ALE and is achieved by means of an analog delay for the signal ALE-fast and by latching to the signal ex-RD for slowed lines ALE', ALE.

Figure 4:
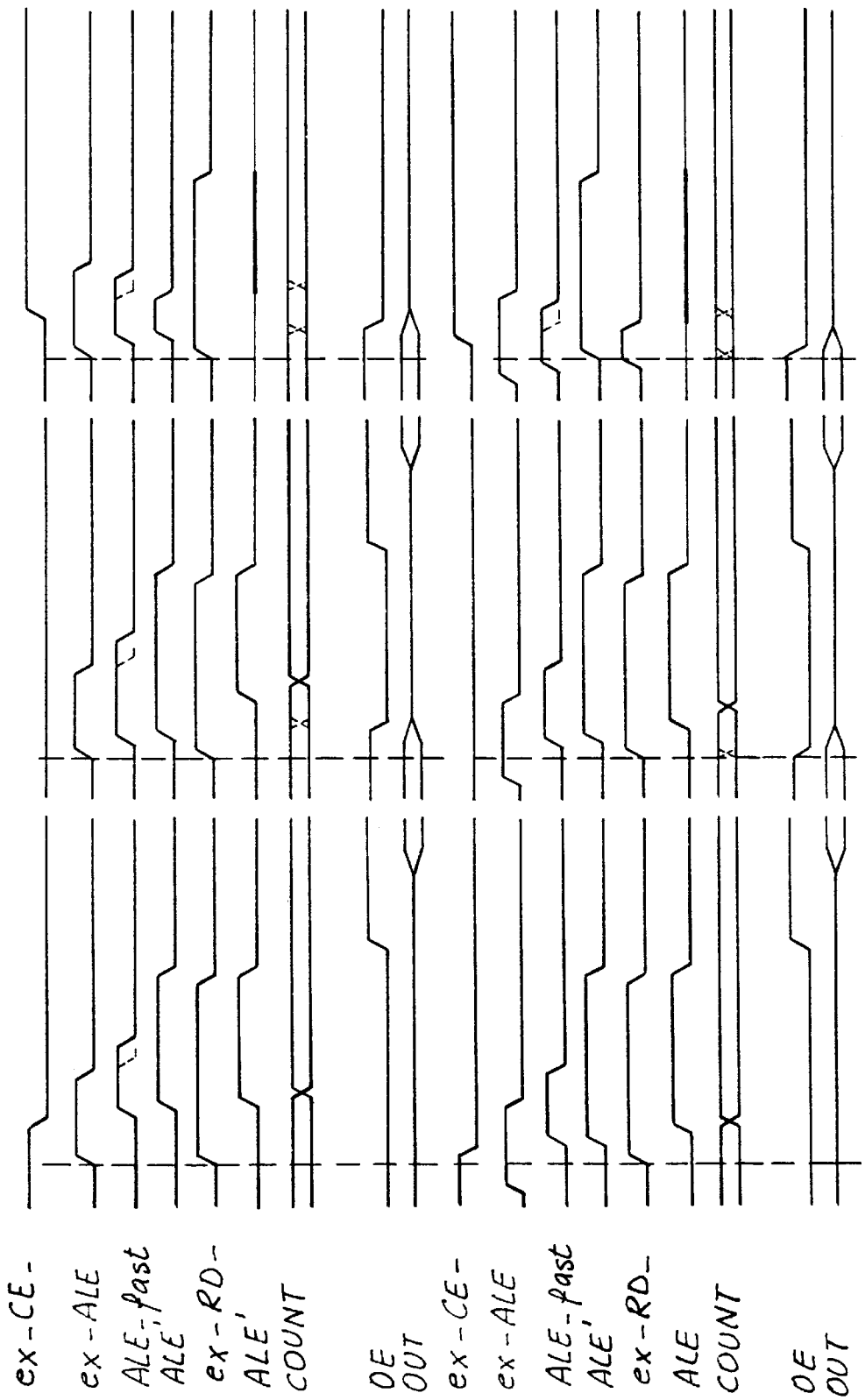
FIG. 4 is a timing chart of the various signals involved in the control circuit according to the present invention.

With reference to the timing chart of FIG. 4, it can be noticed that the dashed lines represent: on the left, a region in which the memory is undergoing the transition from the standby step to the active mode; in the middle, the active mode; and on the far right, the transition from the active mode to standby.

In the transition from standby to active mode, the signal ex-CE switches from high to low, the signal ex-ALE is generated, the signal ALE-fast is generated in a temporally extended form so that it falls after the fall of the signal ex-ALE.

At this point the signal ALE', delayed with respect to the signal ex-ALE, is generated. The signals ALE' and ALE are extended in their duration, synchronously with the signal ex-RD.

In the active mode, central region of the chart of FIG. 4, the activated path is the slow path 4.

The widening of the pulse ALE' and ALE allows to perform assured loading of the address in the memory counter, so that there is no doubt in terms of operation.

During return from standby and transition to the active mode, the rising front of the signal ALE is not time-shifted with respect to the signal ALE-fast and ALE', whereas in the case of the central portion of the chart of FIG. 4, i.e., in the case of the active mode, the rise of the signal ALE is time-shifted with respect to the signals ALE-fast, ALE'.

When the signal CE is high and a signal ex-ALE is produced, then the address latch enable signal ALE is assuredly addressed to the memory and therefore it generates without delay the signal ALE-fast and then the signals ALE' and ALE. On the contrary, when the system is in an active condition (central region of the chart of FIG. 4), in which the signal ex-CE is low and a signal ex-ALE is generated, then there is no assurance that the external address latch enable signal is directed to the memory and therefore the signal ALE is time-shifted with respect to the signal ALE that occurs in the transition from standby to active mode.

This time shift is dictated by a sort of conservative approach in evaluating the signal ex-ALE in order to check whether it is actually intended for the memory.

The right portion of the chart of FIG. 4 illustrates a case in which the signal ALE is suppressed (shown by a thicker line) owing to the fact that the signal ex-ALE occurs before the transition of the signal ex-CE from low to high and there is no change in the signal COUNT that indicates the updating of the address counter.

In practice, the address is not loaded into the counter, differently from what occurs in the other two regions of the chart of FIG. 4.

Therefore, since the signal ex-ALE precedes the change of state of the signal ex-CE, if the signal ex-CE changes from low to high and therefore the memory must assume the standby condition, it is necessary to cancel the signal ALE, since the signal ex-ALE is not assuredly aimed at updating the address of the counter of the memory.

On the contrary, in the transition from the standby step to the active-mode step, i.e., when the signal ex-CE changes from high to low and the signal ex-ALE is generated before this change of state of the signal ex-CE, the signal ALE is not generated with a delay of its rising front, since the address latch enable signal is assuredly intended for the electronic memory.

This is not true in the case of the active-mode cycle, since the signal ex-CE is already low and therefore there is no assurance that the signal will not become high (in which case the signal ALE would have to be suppressed); therefore the signal ALE is time-shifted (i.e., its rising front is delayed) with respect to the signal ALE-fast, to the signal ALE', in order to give the memory the time required to check that the signal ex-CE actually remains low and does not suddenly become high.

Figure 2:
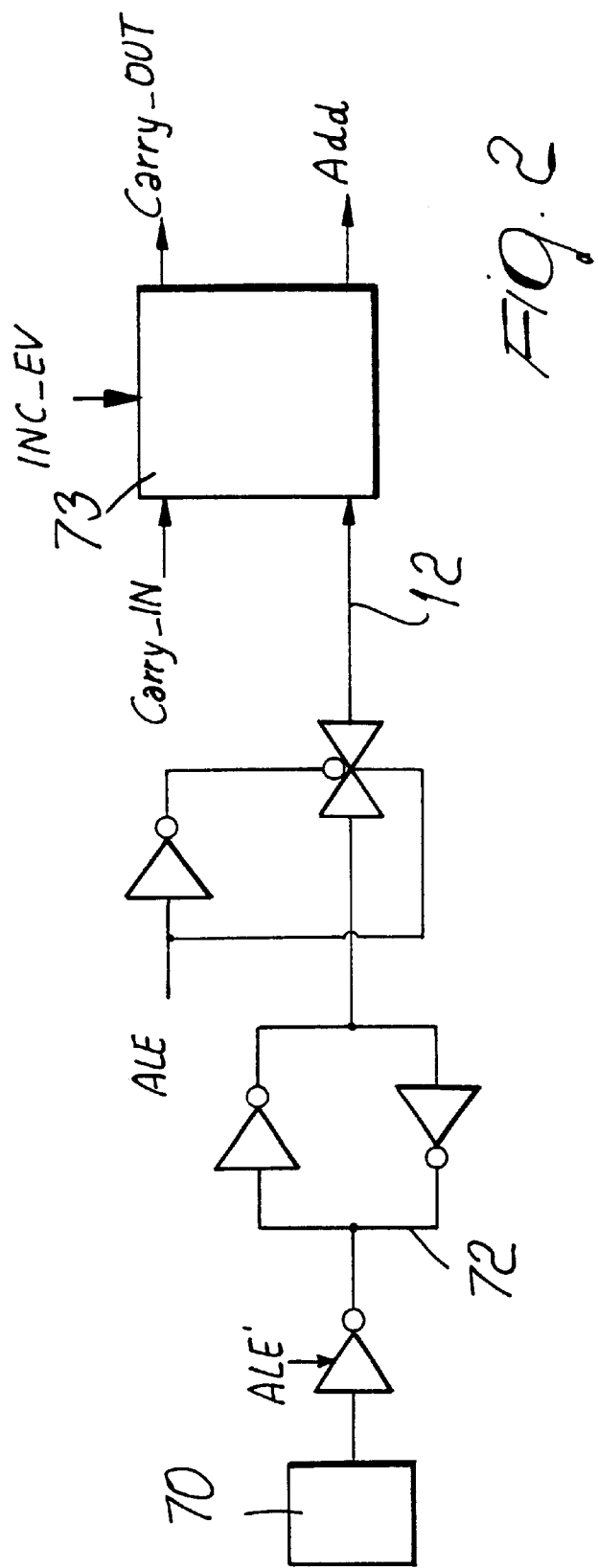
FIG. 2 is a block diagram of a circuit in which it is possible to use the address latch signal obtained by means of the control circuit according to the present invention.

The circuit of FIG. 2 illustrates an example of application of the signal ALE' and of the signal ALE in a counter stage in which the loading of the address ADD-i, represented by the block designated by the reference numeral 70, is performed in a latch circuit 72 by way of the enabling allowed by the signal ALE'.

The signal ALE is then used to enable the transfer of the address from the latch circuit 72 to a block 73 by means of the address bus 12; an address increment signal INC-EV and an input carry signal CARRY-IN are fed into said block 73. The block 73 emits in output an address signal ADD and an output carry signal CARRY-OUT.

In practice it has been observed that the control circuit according to the present invention fully achieves the intended aim and objects, since it allows to manage the address latch enable signal inthe fastest possible mode and most of all with the reliability that is not ensured in conventional circuits.

The circuit thus conceived is susceptible of numerous modifications and variations, all of which are within the scope of the inventive concept; all the details may further be replaced with other technically equivalent elements.

What is claimed is:

1. An address latch control circuit for electronic memories, comprising:
    address sensing means for sensing an external address latch enable signal;
    switching means connected in output to said sensing means;
    address storage means, connected in output to said switching means and to said address sensing means;
    said switching means being suitable to determine the switching between a first circuit path and a second circuit path for connection between said address sensing means and said address storage means for enabling said address storage means;
    said first circuit path connecting said sensing means directly to said address storage means across said switching means;
    said second circuit path connecting said sensing means to said storage means with delay means interposed, said delay means being suitable to produce a time delay in the connection between said address sensing means and said address storage means, said sensing means being suitable to generate an internal address latch enable signal.

2. The circuit according to claim 1, wherein said switching means are driven for switching by a chip enable signal which is characteristic of said memory.

3. The circuit according to claim 1, wherein said delay means are connected between said address sensing means and said switching means.

4. The circuit according to claim 3, further comprising means for adjusting the delay of the connection between said address sensing means and said switching means, said delay being a time delay assigned to said internal address latch enable signal.

5. The circuit according to claim 1, further comprising means for extending the duration of said internal address latch enable signal, said means for extending being connected between said switching means and said delay means.

6. The circuit according to claim 5, wherein said means for extending the duration of said internal address latch enable signal are included both in said first circuit path and in said second circuit path formed by said switching means.

7. The circuit according to claim 5, wherein said means for extending the duration of said internal address latch enable signal are driven by a signal for reading said memory.

8. The circuit according to claim 1, further comprising address latch means which are interposed between said switching means and said storage means.

9. The circuit according to claim 1, wherein said external address latch enable signal sensing means receive in input: said external address latch enable signal; a signal for disabling said address latch enable signal; a chip enable signal which is characteristic of said memory; and a signal for forcing said address latch enable signal.

10. The circuit according to claim 1, wherein said storage means emit two internal address latch enable signals which are suitable to drive an address bus of said memory.

11. An electronic memory, comprising a circuit for controlling an address latch enable signal, said control circuit comprising:
    means for sensing an external address latch enable signal;
    switching means which are connected in output to said sensing means;
    address storage means which are connected in output to said switching means and to said address sensing means;
    said switching means being suitable to determine the switching between a first circuit path and a second circuit path for connection between said address sensing means and said address storage means so as to enable said address storage means;
    said first circuit path connecting said sensing means directly to said storage means across said switching means;
    said second circuit path connecting said sensing means to said address storage means with delay means interposed, said delay means being suitable to delay the connection between said address sensing means and said address storage means, said sensing means being suitable to generate an internal address latch enable signal which is suitable to be stored in said storage means.

12. A method for generating an address latch enable signal for controlling the loading of an address into an address latch of an electronic memory, comprising the steps of:
    sensing the presence of an external address latch enable signal provided to said memory;
    on the basis of the state of a chip enable signal, allowing the direct passage of said external address latch enable signal to the address latch suitable to emit at least one internal address latch enable signal of said memory, said internal enable signal having the shortest possible delay with respect to said external address latch enable signal, delaying the generation of said internal address latch signal in order to allow to check the authenticity of the state of said chip enable signal, or suppressing the generation of said internal address latch signal.

13. The method according to claim 12, comprising a step of extending the duration of said internal address latch enable signal.

14. The method according to claim 12, wherein if said chip enable signal indicates a condition of transition from standby mode to active mode of said memory, the step for direct passage of said external address latch enable signal to said storage means is performed.

15. The method according to claim 12, wherein if said chip enable signal indicates an active mode condition of said memory, the step of delaying the generation of said internal address latch signal is performed.

16. The method according to claim 12, wherein if said chip enable signal indicates a condition of transition of said memory from the active mode to the standby mode, the step of suppressing the generation of said internal address latch signal is performed.

17. The method according to claim 12, wherein said chip enable signal drives switching means which are suitable to form a first direct circuit path and a second indirect circuit path for generating said internal address latch enable signal with a preset delay with respect to said internal address latch enable signal of said memory.

18. The method according to claim 13, wherein the step of extending the duration of said address latch enable signal is controlled by a signal for reading said memory which is characteristic of said memory.

19. An address latch circuit for a memory device, comprising:
   an address latch for selectively storing an externally generated address value provided to the memory device; and
   a control circuit for receiving an externally generated chip enable signal and an externally generated address latch enable signal and enabling the address latch to load the externally generated address value therein for a first period of time, timing of the first period of time being dependent upon the state of the externally generated chip enable signal during the time the externally generated address latch enable signal is asserted.

20. The circuit of claim 19, wherein:
   the first period of time is extended relative to the time the externally generated address latch enable signal is asserted.

21. The circuit of claim 19, wherein:
   the first period of time is a first amount when the externally generated chip enable signal indicates an active state during the time the externally generated address latch enable signal is asserted, and a second amount when the externally generated chip enable signal indicates a transition from a standby state to an active state during the time the externally generated address latch enable signal is asserted, the first amount being greater than the second amount.

22. The circuit of claim 19, wherein:
   the circuit receives a read control signal; and
   the control circuit controls the address latch to latch the externally generated address value therein at the end of the first period of time, the end of the first period of time being substantially synchronized with the read control signal.

23. The circuit of claim 19, wherein:
   the address latch includes a selectively enabled output; and
   the control circuit enables the selectively enabled output for a second period of time, the second period of time having an extended duration relative to the time the externally generated address latch enable signal is asserted.

24. The circuit of claim 23, wherein:
   the second period of time is a first amount when the externally generated chip enable signal indicates an active state during the time the externally generated address latch enable signal is asserted, and a second amount when the externally generated chip enable signal indicates a transition from a standby state to an active state during the time the externally generated address latch enable signal is asserted, the first amount being greater than the second amount.

25. The circuit of claim 23, wherein:
   the second period of time is a first amount when the externally generated chip enable signal indicates an active state during the time the externally generated address latch enable signal is asserted, and a second amount when the externally generated chip enable signal indicates a transition from an active state to a standby state during the time the externally generated address latch enable signal is asserted, the first amount being greater than the second amount.

26. The circuit of claim 25, wherein:
   the second amount is substantially zero amount of time.

27. The circuit of claim 19, wherein:
   the address latch includes a selectively enabled output; and
   the control circuit enables the selectively enabled output of the address latch a delayed amount of time that is dependent upon the state of the externally generated chip enable signal during the time the externally generated address latch enable signal is asserted.

28. A method for controlling an address latch of a memory device, comprising:
   detecting an assertion of an externally generated address latch enable signal provided to the memory device;
   following the initial assertion of the externally generated address latch enable signal, enabling the address latch to load an address value therein during a first period of time, the timing of the first period of time being based upon the state of an externally generated chip enable signal during the time the externally generated address latch enable signal is asserted.

29. The method of claim 28, wherein:
   the first period of time has an extended duration relative to the time the externally generated address latch enable signal is asserted.

30. The method of claim 28, wherein:
   the first period of time is a first amount when the externally generated chip enable signal indicates an active state during the time the externally generated address latch enable signal is asserted, and a second amount when the externally generated chip enable signal indicates a transition from a standby state to the active state during the time the externally generated address latch enable signal is asserted, the second amount being less than the first amount.

31. The method of claim 28, wherein:
   the first period of time is initiated when an externally generated chip enable signal transitions from a standby state to an active state during the time the externally generated address latch enable signal is asserted; and the first period of time is initiated a delayed amount relative to the initial assertion of the externally generated address latch enable signal, when the externally generated chip enable signal indicates an active state during the time the externally generated address latch enable signal is asserted.

32. The method of claim 28, further comprising:

disabling the address latch so as to latch the address value therein following the enabling, the disabling initially occurring substantially in synchronism with an externally generated read control signal provided to the memory device.

* * * * *